United States Patent [19]
Ryu

[11] Patent Number: 5,703,812
[45] Date of Patent: Dec. 30, 1997

[54] MULTI-BIT DATA OUTPUT BUFFER FOR SEMICONDUCTOR MEMORY DEVICE

[75] Inventor: Myung Sun Ryu, Kyoungki-do, Rep. of Korea

[73] Assignee: Hyundai Electronics Industries Co., Ltd., Ichon-kun, Rep. of Korea

[21] Appl. No.: 674,160

[22] Filed: Jul. 1, 1996

[30] Foreign Application Priority Data

Jun. 30, 1995 [KR] Rep. of Korea ............ 95-18855

[51] Int. Cl.$^6$ ............................................. G11C 7/00
[52] U.S. Cl. .......................... 365/189.05; 365/189.07; 327/108; 327/379
[58] Field of Search ............... 365/189.05, 189.07; 327/379, 380, 381, 382, 383, 108

[56] References Cited

U.S. PATENT DOCUMENTS

| | | | |
|---|---|---|---|
| 4,910,710 | 3/1990 | Kobatake | 365/189.01 |
| 5,237,213 | 8/1993 | Tanoi | 307/290 |
| 5,255,239 | 10/1993 | Taborn et al. | 365/221 |
| 5,369,316 | 11/1994 | Chen et al. | 326/83 |
| 5,430,335 | 7/1995 | Tanoi | 327/170 |

FOREIGN PATENT DOCUMENTS 406090152  3/1994  Japan .

Primary Examiner—David C. Nelms
Assistant Examiner—Hien Nguyen
Attorney, Agent, or Firm—Reid & Priest L.L.P.

[57] ABSTRACT

A multi-bit data output buffer for a semiconductor memory device, comprising a data input circuit for inputting at least two bit data, at least two bit data buffering circuits, each of at least two bit data buffering circuits buffering a corresponding one of at least two bit data from the data input circuit, and a bit data comparison circuit for controlling the amounts of current flowing to at least two bit data buffering circuits according to logic values of at least two bit data from the data input circuit. According to the present invention, the multi-bit data output buffer is capable of minimizing the generation of noise in the output data and enhancing a response speed of the output data with respect to the input data.

4 Claims, 3 Drawing Sheets

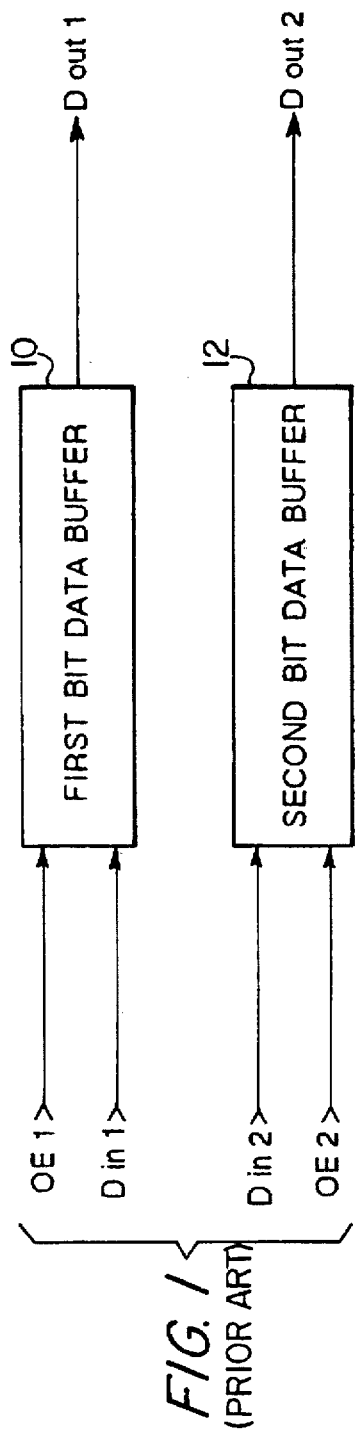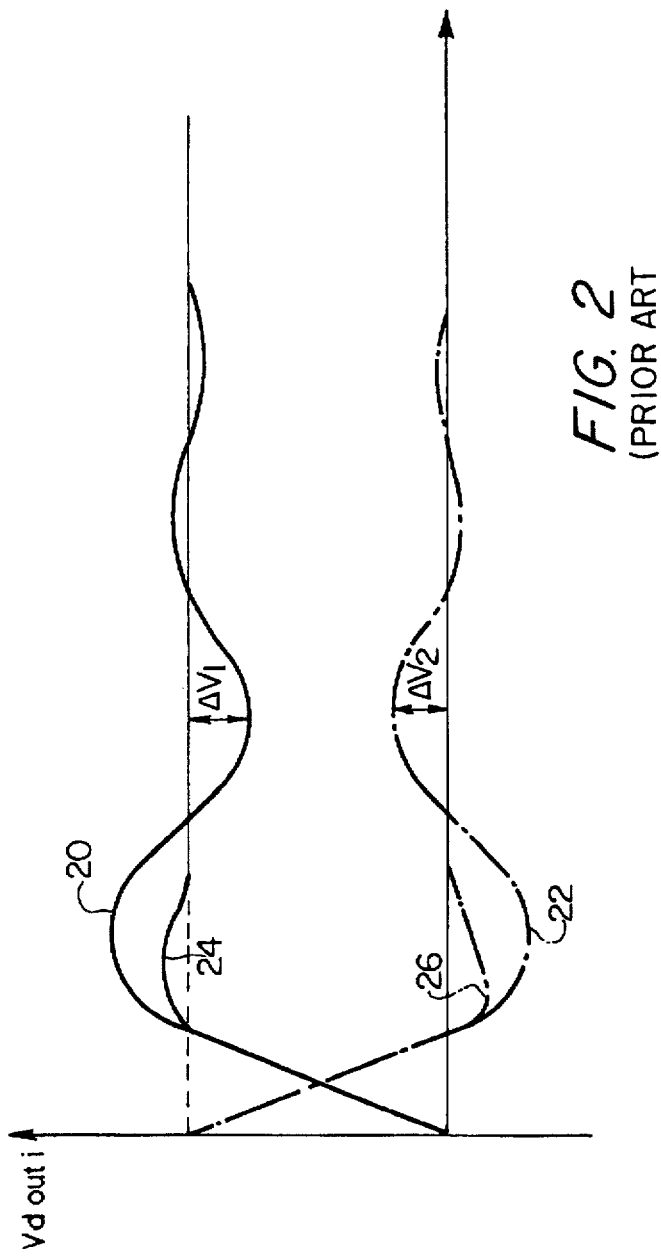
FIG. 1 (PRIOR ART)
FIG. 2 (PRIOR ART)

MULTI-BIT DATA OUTPUT BUFFER FOR SEMICONDUCTOR MEMORY DEVICE

BACKGROUND OF THE INVENTION

1. Field of the Invention

The present invention relates, in general, to a multi-bit data output buffer for transferring multi-bit data from a semiconductor memory device to the peripheral circuit, and more particularly, to a multi-bit data output buffer for a semiconductor memory device which is capable of minimizing the generation of noise in multi-bit data.

2. Description of the Prior Art

Generally, a semiconductor memory device such as a dynamic random access memory and a static random access memory, are manufactured to simultaneously read and write bits of 2-bit, 4-bit, . . . , 32-bit data according to the requirements of purchasers. In this connection, the semiconductor memory device requires a data output buffer which is capable of simultaneously buffering the bits of the multi-bit data to input and output the multi-bit data.

Such a conventional multi-bit data output buffer comprises a plurality of buffering circuits for individually buffering the bits of the multi-bit data. Such a circuit construction of the conventional multi-bit data output buffer results in an abrupt variation of current when the bits of the multi-bit data are all 0 or 1 in logic. For this reason, the conventional multi-bit data output buffer generates its output signal, which has a very high noise component and a degraded response speed with respect to an input signal. The above problem with the conventional multi-bit data output buffer will hereinafter be described with reference to FIGS. 1 and 2.

Referring to FIG. 1, there is schematically shown, in block form, the construction of a conventional multi-bit data output buffer for a semiconductor memory device. As shown in this drawing, the conventional multi-bit data output buffer comprises a first bit data buffering circuit 10 for receiving a first output enable signal OE1 and a first input bit data Din1, and a second bit data buffering circuit 12 for receiving a second output enable signal OE1 and a second input bit data Din2.

When the first output enable signal OE1 is high in logic, the first bit data buffering circuit 10 buffers the first input bit data Din1 and outputs the buffered first input bit data as first output bit data Dout1.

When the second output enable signal OE2 is high in logic, the second bit data buffering circuit 12 buffers the second input bit data Din2 and outputs the buffered second input bit data as second output bit data Dout2.

FIG. 2 is a waveform diagram illustrating an output voltage characteristic of the conventional multi-bit data output buffer. In the case where the first output bit data Dout1 from the first bit data buffering circuit 10 has the same logic value as that of the second output bit data Dout2 from the second bit data buffering circuit 12, it has a voltage varying in the form of a first curved line 20 or a second curved line 22. The first curved line 20 indicates voltage variations of the first and second output bit data Dout1 and Dout2 from the first and second bit data buffering circuits 10 and 12 when the first and second output bit data Dout1 and Dout2 are both 1 in logic. In contrast, the second curved line 22 indicates voltage variations of the first and second output bit data Dout1 and Dout2 from the first and second bit data buffering circuits 10 and 12, when the first and second output bit data Dout1 and Dout2 are both 0 in logic.

In FIG. 2, third and fourth curved lines 24 and 26 indicate voltage variations of the first and second output bit data Dout1 and Dout2 from the first and second bit data buffering circuits 10 and 12 when the first and second output bit data Dout1 and Dout2 have the opposite logic values. In other words, when the first output bit data Dout1 from the first bit data buffering circuit 10 is 1 in logic and the second output bit data Dout2 from the second bit data buffering circuit 12 is 0 in logic, the third curved line 24 indicates a voltage variation of the first output bit data Dout1 and the fourth curved line 26 indicates a voltage variation of the second output bit data Dout2. In contrast, in the case where the first output bit data Dout1 from the first bit data buffering circuit 10, is 0 in logic and the second output bit data Dout2 from the second bit data buffering circuit 12 is 1 in logic, the fourth curved line 26 indicates a voltage variation of the first output bit data Dout1 and the third curved line 24 indicates a voltage variation of the second output bit data Dout2.

As shown in FIGS. 1 and 2, the conventional multi-bit data output buffer has a disadvantage in that it abruptly varies the voltage of the output data when all the input bit data have the same logic value. For this reason, the conventional multi-bit data output buffer generates an output signal which has a very high noise component and a degraded response speed with respect to an input signal.

SUMMARY OF THE INVENTION

Therefore, the present invention has been made in view of the above problem, and it is an object of the present invention to provide a multi-bit data output buffer for a semiconductor memory device which is capable of minimizing the generation of noise in an output signal and enhancing a response speed of the output signal, regardless of logic values of a multi-bit data.

In accordance with the present invention, the above and other objects can be accomplished by a provision of a multi-bit data output buffer for a semiconductor memory device, comprising data input means for inputting at least two bit data; at least two bit data buffering means, each of at least two bit data buffering means buffering a corresponding one of at least two bit data from the data input means; and bit data comparison means for controlling the amounts of current flowing to at least two bit data buffering means according to logic values of at least two bit data from the data input means.

BRIEF DESCRIPTION OF THE DRAWINGS

The above and other objects, features and advantages of the present invention will be more clearly understood from the following detailed description taken in conjunction with the accompanying drawings, in which:

FIG. 1 is a schematic block diagram illustrating the construction of a conventional multi-bit data output buffer for a semiconductor memory device;

FIG. 2 is a waveform diagram illustrating an output voltage characteristic of the conventional multi-bit data output buffer;

DETAILED DESCRIPTION OF THE PREFERRED EMBODIMENTS

Figure 3:
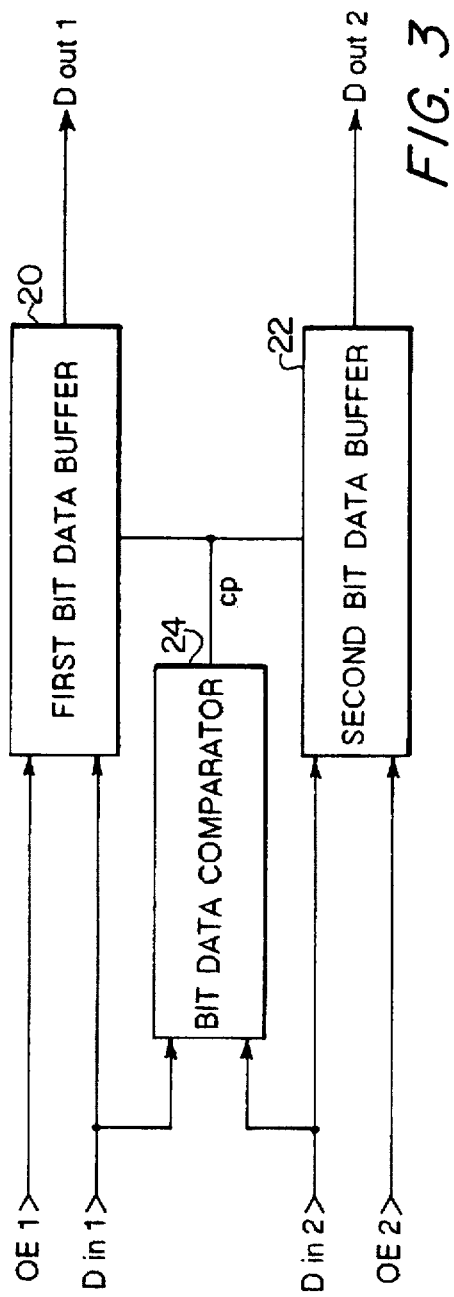
FIG. 3 is a schematic block diagram illustrating the construction of a multi-bit data output buffer for a semiconductor memory device, in accordance with an embodiment of the present invention.

Referring to FIG. 3, the construction of a multi-bit data output buffer for a semiconductor memory device in accordance with an embodiment of the present invention, is schematically depicted.

As shown in this drawing, the multi-bit data output buffer comprises a first bit data buffering circuit 20 for receiving a first output enable signal OE1 and a first input bit data Din1, a second bit data buffering circuit 22 for receiving a second output enable signal OE1 and a second input bit data Din2, and a bit data comparison circuit 24 for receiving the first and a second input bit data Din1 and Din2.

When the first output enable signal OE1 is high in logic, the first bit data buffering circuit 20 buffers the first input bit data Din1 and transfers the buffered first input bit data as first output bit data Dout1, to the peripheral equipment (not shown). Similarly, when the second output enable signal OE2 is high in logic, the second bit data buffering circuit 22 buffers the second input bit data Din2 and outputs the buffered second input bit data as second output bit data Dout2, to the peripheral equipment.

The bit data comparison circuit 24 is adapted to compare logic values of the first and second input bit data Din1 and Din2 with each other and to generate a comparison signal CP of high or low logic in accordance with the compared result. The bit data comparison circuit 24 then applies the generated comparison signal CP to the first and second bit data buffering circuits 20 and 22. The comparison signal CP from the bit data comparison circuit 24 has a low logic value when the first and second input bit data Din1 and Din2 have the same logic value. To the contrary, in the case where the first and second input bit data Din1 and Din2 have the opposite logic values, the comparison signal CP from the bit data comparison circuit 24 has a high logic value.

The bit data comparison circuit 24 generates the comparison signal CP to vary impedances of the first and second bit data buffering circuits 20 and 22 and thus to vary the amounts of current flowing thereto. When the comparison signal CP from the bit data comparison circuit 24 is low in logic, the impedances of the first and second bit data buffering circuits 20 and 22 are increased, whereas the amounts of current flowing thereto are reduced. In contrast, in the case where the comparison signal CP from the bit data comparison circuit 24 is high in logic, the impedances of the first and second bit data buffering circuits 20 and 22 are reduced, whereas the amounts of current flowing thereto are increased.

In the case where the first and second input bit data Din1 and Din2 have the same logic value, the amounts of current flowing to the first and second bit data buffering circuits 20 and 22 are reduced, resulting in reductions in voltages varying width and interval of the first and second output bit data Dout1 and Dout2 therefrom. As a result, the first and second output bit data Dout1 and Dout2 from the first and second bit data buffering circuits 20 and 22 have noise components suppressed at the maximum and enhanced response speed with respect to the first and second input bit data Din1 and Din2.

Figure 4:
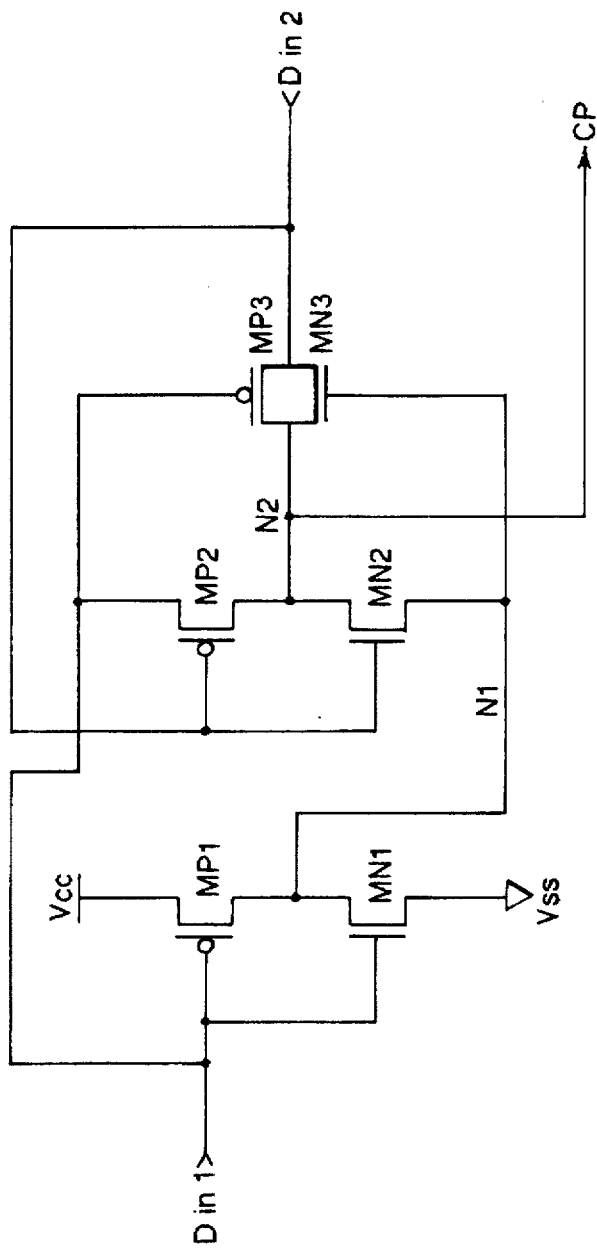
FIG. 4 is a detailed circuit diagram of a bit data comparison circuit in FIG. 3.

Referring to FIG. 4, there is shown a detailed circuit diagram of the bit data comparison circuit 24 in FIG. 3. As shown in this drawing, the bit data comparison circuit 24 includes first PMOS and first NMOS transistors MP1 and MN1 having their gates for commonly receiving the first input bit data Din1. The first PMOS transistor MP1 transfers a high voltage from a first voltage source Vcc to a first node N1 when the first input bit data Din1 is low in logic. The first NMOS transistor MN1 transfers a low voltage from a second voltage source Vss to the first node N1 when the first input bit data Din1 is high in logic. As a result, the first PMOS and first NMOS transistors MP1 and MN1 function to invert the logic value of the first input bit data Din1.

The bit data comparison circuit 24 further includes second PMOS and second NMOS transistors MP2 and MN2 having their gates for commonly receiving the second input bit data Din2. The second PMOS transistor MP2 transfers the first input bit data Din1 as the comparison signal CP to a second node N2 when the second input bit data Din2 is low in logic. In contrast, the second NMOS transistor MN2 transfers the inverted first input bit data from the first node N1 as the comparison signal CP to the second node N2 when the second input bit data Din2 is high in logic.

When the first and second input bit data Din1 and Din2 have the same logic value, the first PMOS and first NMOS transistors MP1 and MN1 and the second PMOS and second NMOS transistors MP2 and MN2 cooperate to allow the comparison signal CP at the second node N2 to go low in logic. In contrast, in the case where the first and second input bit data Din1 and Din2 have the opposite logic values, the first PMOS and first NMOS transistors MP1 and MN1 and the second PMOS and second NMOS transistors MP2 and MN2 cooperate to allow the comparison signal CP at the second node N2 to go high in logic. The relation between the first and second input bit data Din1 and Din2 and the comparison signal CP can be expressed by the following table 1:

TABLE 1

| Din 1 | Din 2 | CP |
|---|---|---|
| 0 | 0 | 0 |
| 0 | 1 | 1 |
| 1 | 0 | 1 |
| 1 | 1 | 0 |

The bit data comparison circuit 24 further includes a third PMOS transistor MP3 having a gate for receiving the first input bit data Din1, and a third NMOS transistor MN3, having a gate for receiving the inverted first input bit data from the first node N1. The third PMOS transistor MP3 transfers the second input bit data Din2 to the second node N2 when the first input bit data Din1 is low in logic. The third NMOS transistor MN3 transfers the second input bit data Din2 to the second node N2 when the inverted first input bit data from the first node N1 is high in logic. As a result, the third PMOS and third NMOS transistors MP3 and MN3 constitute a transfer transistor circuit which has a low resistance and a high transfer speed to increase the amount of current at the second node N2.

Figure 5:
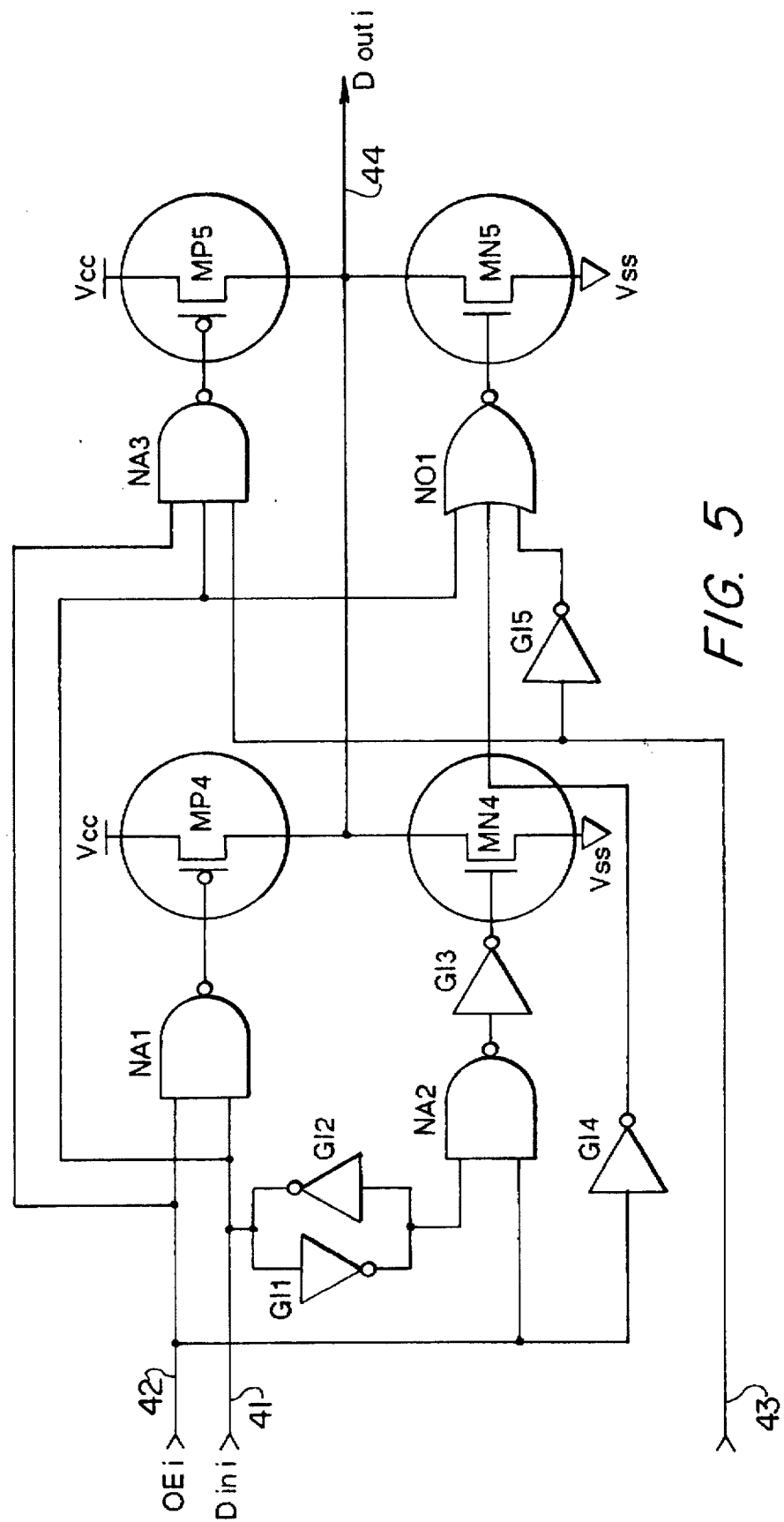
FIG. 5 is a detailed circuit diagram of a bit data buffering circuit in FIG. 3.

Referring to FIG. 5, a detailed circuit diagram of each of the first and second bit data buffering circuits 20 and 22 in FIG. 3, is shown. Also shown in this drawing is the bit data buffering circuit which includes first and second NAND gates NA1 and NA2 for commonly receiving an output enable signal OEi from a first control line 42, a first pull-up PMOS transistor MP4 connected between the first voltage source Vcc and an output line 44, and a first pull-down NMOS transistor MN4 connected between the second voltage source Vss and the output line 44. When the output enable signal OEi from the first control line 42 is high in logic, the first NAND gate NA1 inverts input bit data Dini from a data input line 41 and supplies the inverted input bit data to a gate of the first pull-up PMOS transistor MP4. The first pull-up PMOS transistor MP4 transfers the high voltage from the fist voltage source Vcc to the output line 44 when an output signal from the first NAND gate NA1 is low in logic. As a result, high logic output data Douti is generated on the output line 44.

Also when the output enable signal OEi from the first control line 42 is high in logic, the second NAND gate NA2 inverts an output signal from a first inverter GI1 and supplies the inverted signal to a gate of the first pull-down NMOS transistor MN4 through a third inverter GI3. The output signal from the first inverter GI1 is an inverted one of the input bit data Dini from the data input line 41. An output signal from the third inverter GI3 has the same logic value as that of the input bit data Dini from the data input line 41. A second inverter GI2 is connected to the first inverter GI1 to form a cyclic loop therewith for stabilizing the logic state of the input bit data Dini from the data input line 41. When the output signal from the third inverter GI3 is high in logic, the first pull-down NMOS transistor MN4 transfers the low voltage from the second voltage source Vss to the output line 44. As a result, low logic output data Douti is generated on the output line 44.

As a result, the first and second NAND gates NA1 and NA2 and the first to third inverters GI1-GI3 act to transfer the input bit data Dini from the data input line 41 to the gate of the first pull-up PMOS transistor MP4 and the gate of the first pull-down NMOS transistor MN4, according to the logic value of the output enable signal OEi from the first control line 42.

The bit data buffering circuit further includes a third NAND gate NA3 for receiving a comparison signal CP from a second control line 43, a NOR gate NO1 for receiving output signals from fourth and fifth inverters GI4 and GI5, a second pull-up PMOS transistor MP5 connected between the first voltage source Vcc and the output line 44, and a second pull-down NMOS transistor MN5 connected between the second voltage source Vss and the output line 44. The third NAND gate NA3 is adapted to NAND the comparison signal CP from the second control line 43, the output enable signal OEi from the first control line 42 and the input bit data Dini from the data input line 41. When the comparison signal CP from the second control line 43 and the output enable signal OEi from the first control line 42 are both high in logic, the third NAND gate NA3 inverts the input bit data Dini from the data input line 41 and transfers the inverted input bit data to a gate of the second pull-up PMOS transistor MP5.

The output signal from the fourth inverter GI4 is an inverted one of the output enable signal OEi from the first control line 42, and the output signal from the fifth inverter GI5 is an inverted one of the comparison signal CP from the second control line 43. The NOR gate NO1 is adapted to NOR the output signals from the fourth and fifth inverters GI4 and GI5, and the input bit data Dini from the data input line 41. When the output signals from the fourth and fifth inverters GI4 and GI5 are both low in logic, namely, when the output enable signal OEi from the first control line 42 and the comparison signal CP from the second control line 43 are both high in logic, the NOR gate NO1 inverts the input bit data Dini from the data input line 41 and transfers the inverted input bit data to a gate of the second pull-down NMOS transistor MN5.

As a result, the fourth and fifth inverters GI4 and GI5, the third NAND gate NA3 and the NOR gate NO1 function as a control switch for transferring the input bit data Dini from the data input line 41 to the gate of the second pull-up PMOS transistor MP5, and the gate of the second pull-down NMOS transistor MN5, when the output enable signal OEi from the first control line 42, and the comparison signal CP from the second control line 43 have a specified logic value, namely, when data to be outputted in a data output mode have different logic values.

The second pull-up PMOS transistor MP5 transfers the high voltage from the first voltage source Vcc to the output line 44 when an output signal from the third NAND gate NA3 is low in logic. As a result, the second pull-up PMOS transistor MP5 forms a parallel current path between the first voltage source Vcc and the output line 44, together with the first pull-up PMOS transistor MP4, to abruptly vary a voltage on the output line 44. At this time, a low impedance is present between the first voltage source Vcc and the output line 44. However, in the case where the comparison signal CP from the second control line 43 is low in logic, the second pull-up PMOS transistor MP5 is turned off to increase the impedance between the first voltage source Vcc and the output line 44, and thus, to gently vary the voltage on the output line 44.

The second pull-down NMOS transistor MN5 transfers the low voltage from the second voltage source Vss to the output line 44 when an output signal from the NOR gate NO1 is high in logic. As a result, the second pull-down NMOS transistor MN5 forms a parallel current path between the second voltage source Vss and the output line 44, together with the first pull-down NMOS transistor MN4, to abruptly vary the voltage on the output line 44. At this time, a low impedance is present between the second voltage source Vss and the output line 44. However, in the case where the comparison signal CP from the second control line 43 is low in logic, the second pull-down NMOS transistor MN5 is turned off to increase the impedance between the second voltage source Vss and the output line 44, thereby causing the voltage on the output line 44 to gently vary.

As is apparent from the above description, according to the present invention, the multi-bit data output buffer controls the voltage variation of output data by controlling the amounts of current flowing to the bit data buffering circuits according to whether the plurality of input bit data have the same logic value. Therefore, the multi-bit data output buffer of the present invention has the effect of minimizing the generation of noise in the output data and enhancing the response speed of the output data with respect to the input data.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A multi-bit data output buffer for a semiconductor memory device, the buffer comprising:

data input means for inputting at least two bits of data whose logic values are independent of each other;

at least two bit data buffering means for buffering respective ones of the at least two bits of data from said data input means; and bit data comparison means for comparing the logic values of the at least two bits of data from the data input means to produce a comparison signal that represents a comparison of the logic values of the at least two bits, and for controlling amounts of current flowing to said at least two bit data buffering means based on the comparison signal.

2. The buffer of claim 1, wherein said bit data comparison means constitutes:

means for reducing the amounts of current flowing to said at least two bit data buffering means when the at least two bits of data from said data input means have a same logic value.

3. The buffer of claim 1, wherein said bit data comparison means includes:

means for performing an exclusive-OR operation with respect to the at least two bits of data from said data input means.

4. The buffer of claim 1, wherein each of said at least two bit data buffering means includes:

a first pull-up driver, connected between a first voltage source and an output line, for transferring a high voltage from said first voltage source to said output line according to the logic value of a corresponding bit of data;

a first pull-down driver, connected between a second voltage source and said output line, said first pull-down driver being driven complementarily to said first pull-up driver, to transfer a low voltage from said second voltage source to said output line according to the logic value of the corresponding bit of data;

a second pull-up driver, connected between said first voltage source and said output line, for transferring the high voltage from said first voltage source to said output line, according to the logic value of the corresponding bit of data;

a second pull-down driver, connected between second voltage source and said output line, said second pull-down driver being driven complementarily to said second pull-up driver, to transfer the low voltage from said second voltage source to said output line according to the logic value of the corresponding bit of data; and switching means for switching the corresponding bit of data to said second pull-up driver and said second pull-down driver according to a logic value of the comparison signal from said bit data comparison means.

* * * * *